(12) United States Patent
Stirton et al.

(10) Patent No.: US 6,582,863 B1
(45) Date of Patent: Jun. 24, 2003

(54) METHOD OF CONTROLLING PHOTOLITHOGRAPHY PROCESSES BASED UPON SCATTEROMETRIC MEASUREMENTS OF SUB-NOMINAL GRATING STRUCTURES

(75) Inventors: James Broc Stirton, Austin, TX (US); Kevin R. Lensing, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 208 days.

(21) Appl. No.: 09/879,751

(22) Filed: Jun. 11, 2001

(51) Int. Cl.$^7$ .................................................. G03F 9/00
(52) U.S. Cl. ........................................................ 430/30
(58) Field of Search ............................................ 430/30

(56) References Cited

U.S. PATENT DOCUMENTS

| | | | |
|---|---|---|---|
| 5,867,276 A | 2/1999 | McNeil et al. | 356/445 |
| 5,877,860 A | 3/1999 | Borden | 356/376 |
| 5,880,838 A | 3/1999 | Marx et al. | 356/351 |
| 6,051,348 A | 4/2000 | Marinaro et al. | 430/30 |
| 6,081,334 A | 6/2000 | Grimbergen et al. | 356/357 |
| 6,245,584 B1 | 6/2001 | Marinaro et al. | 438/14 |

*Primary Examiner*—Christopher G. Young
(74) *Attorney, Agent, or Firm*—Williams, Morgan & Amerson, P.C.

(57) ABSTRACT

The present invention is generally directed to a method of controlling photolithography processes based upon scatterometric measurements of sub-nominal grating structures, and a system for accomplishing same. In one embodiment, the method comprises providing a library of optical characteristic traces, each of which corresponds to a sub-nominal grating structure comprised of a plurality of photoresist features having a known degree of residual photoresist material positioned between the photoresist features, forming a process layer above a semiconducting substrate, and forming a layer of photoresist above the process layer. The method further comprises forming at least one sub-nominal grating structure in the layer of photoresist, the sub-nominal grating structure being comprised of a plurality of photoresist features, illuminating the formed sub-nominal grating structure, measuring light reflected off of the formed sub-nominal grating structure to generate an optical characteristic trace for the formed sub-nominal grating structure, and determining the presence of residual photoresist material between the features of the formed sub-nominal grating structure by comparing the generated optical characteristic trace to at least one optical characteristic trace from the library.

84 Claims, 4 Drawing Sheets

METHOD OF CONTROLLING PHOTOLITHOGRAPHY PROCESSES BASED UPON SCATTEROMETRIC MEASUREMENTS OF SUB-NOMINAL GRATING STRUCTURES

BACKGROUND OF THE INVENTION

1. Field of the Invention

This invention relates generally to semiconductor fabrication technology, and, more particularly, to a method of controlling photolithography processes based upon scatterometric measurements of sub-nominal grating structures, and system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, an illustrative field effect transistor 10, as shown in FIG. 1, may be formed above a surface 11A of a semiconducting substrate or wafer 11 comprised of doped-silicon. In the process of forming integrated circuit devices, millions of transistors, such as the illustrative transistor 10 depicted in FIG. 1, are formed above a semiconducting substrate. The substrate 11 may be doped with either N-type or P-type dopant materials, for example. The transistor 10 may have a doped polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown). Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modern semiconductor manufacturing operations. Other examples include, but are not limited to, conductive lines, openings in insulating layers to allow subsequent formation of a conductive interconnection, ie, a conductive line or contact, therein, etc.

In general, semiconductor manufacturing operations involve, among other things, the formation of layers of various materials, e.g., polysilicon, metals, insulating materials, etc., and the selective removal of portions of those layers by performing known photolithographic and etching techniques. These processes are continued until such time as the integrated circuit device is complete.

During the course of fabricating such integrated circuit devices, a variety of features, e.g., gate electrodes, conductive lines, openings in layers of insulating material, etc., are formed to very precisely controlled dimensions. Such dimensions are sometimes referred to as the critical dimension (CD) of the feature. It is very important in modern semiconductor processing that features be formed as accurately as possible due to the reduced size of those features in such modern devices. For example, gate electrodes may now be patterned to a width 12 that is approximately 0.18 $\mu$m (1800 ↑), and further reductions are planned in the future. As stated previously, the width 12 of the gate electrode 14 corresponds approximately to the channel length 13 of the transistor 10 when it is operational. Thus, even slight variations in the actual dimension of the feature as fabricated may adversely affect device performance. Thus, there is a great desire for a method that may be used to accurately, reliably and repeatedly form features to their desired critical dimension, i.e., to form the gate electrode 14 to its desired critical dimension 12.

Photolithography is a process typically employed in semiconductor manufacturing. Photolithography generally involves forming a layer of photoresist material (positive or negative) above one or more layers of material, e.g., polysilicon, silicon dioxide, that are desired to be patterned. Thereafter, a pattern that is desired to be formed in the underlying layer or layers of material is initially formed in the layer of photoresist using an appropriate stepper tool and known photolithographic techniques, i.e., an image on a reticle in the stepper tool is transferred to the layer of photoresist. Then, the layer of photoresist is developed so as to leave in place a patterned layer of photoresist substantially corresponding to the pattern on the reticle. This patterned layer of photoresist is then used as a mask in subsequent etching processes, wet or dry, performed on the underlying layer or layers of material, e.g., a layer of polysilicon, metal or insulating material, to transfer the desired pattern to the underlying layer. The patterned layer of photoresist is comprised of a plurality of features, e.g., line-type features or opening-type features, that are to be replicated in an underlying process layer. The features in the patterned layer of photoresist also have a critical dimension, sometimes referred to as a develop inspect critical dimension (DICD).

More particularly, in one illustrative embodiment, modern photolithography processes generally involve the steps of: (1) applying a layer of photoresist above a wafer, typically accomplished by a spin-coating process; (2) pre-baking (or soft-baking) the layer of photoresist at a temperature of approximately 90–120° C. to reduce the level of solvents in the layer of photoresist and to improve the adhesion characteristics of the photoresist; (3) performing an exposure process, wherein a pattern is projected onto the layer of photoresist through a reticle used in a stepper tool to create a latent image in the layer of photoresist; (4) performing a post-exposure bake on the layer of photoresist at a temperature approximately 5–15° C. higher than the pre-bake process; (5) performing a develop process to turn the latent image in the layer of photoresist into the final resist image; and (6) performing a post-bake process (or hard-bake) at a temperature of approximately 125–160° C. to remove residual solids, improve adhesion, and to increase the etch resistance of the photoresist. These process steps are well known to those skilled in the art and, thus, will not be described herein in any greater detail.

Further background for the present invention will now be described with reference to FIGS. 2A–2B. As shown in FIG. 2A, a process layer 15 is formed above a semiconducting substrate 11 (or other previously-formed process layer), and a layer of photoresist material (positive or negative) 17 is formed above the process layer 15. The process layer 15 is meant to be illustrative of any type of material that may be patterned using known photolithographic and etching techniques.

Using known photolithographic techniques, the layer of photoresist material 17 is patterned to define a plurality of photoresist features 17A that are intended to be used as a mask in patterning the underlying process layer 15. See FIG. 2B. However, for a variety of reasons, the photolithography process may be incomplete and result in residual amounts of photoresist material 19 remaining between the photoresist features 17A. In the industry, this situation is sometimes referred to as photoresist "scumming." Such scumming may be the result of a variety of factors, e.g., low stepper exposure dose, improper focus, insufficient develop time, change in substrate, etc. Additionally, the profile of the features 17A may also be degraded, as indicated by the dashed lines 21 in FIG. 2B, as part of the scumming phenomenon.

Photoresist scumming can cause many problems in subsequent manufacturing operations. For example, the ability to completely etch the underlying process layer 15 may be hampered due to the presence of the residual photoresist material 19, i.e., etching of the process layer 15 may be incomplete. As a result, device performance may be adversely impacted, and/or wafers may have to be re-worked to correct problems caused by photoresist scumming. Moreover, photoresist scumming becomes even more problematic as device feature sizes continue to decrease (with resulting increased density). That is, as device features continue to decrease and packing density continues to increase, photoresist scumming is more likely to occur. Lastly, photoresist scumming may not be uniform across the entire surface of the wafer, i.e., scumming may only occur in certain areas of the wafer.

The present invention is directed to a method and system that may solve, or at least reduce, some or all of the aforementioned problems.

SUMMARY OF THE INVENTION

The present invention is generally directed to methods of controlling photolithography processes based upon scatterometric measurements of sub-nominal grating structures, and a system for accomplishing same. In one illustrative embodiment, the method comprises providing a library of optical characteristic traces, each of which corresponds to a sub-nominal grating structure comprised of a plurality of photoresist features having a known degree of residual photoresist material positioned between the features, forming a process layer above a semiconducting substrate, and forming a layer of photoresist above the process layer. The method further comprises forming at least one sub-nominal grating structure in the layer of photoresist, the sub-nominal grating structure being comprised of a plurality of photoresist features, illuminating the formed sub-nominal grating structure, measuring light reflected off of the formed sub-nominal grating structure to generate an optical characteristic trace for the formed sub-nominal grating structure, and determining the presence of residual photoresist material between the features of the formed sub-nominal grating structure by comparing the generated optical characteristic trace to at least one optical characteristic trace from the library.

In another illustrative embodiment, the method comprises providing a wafer having at least one process layer and a layer of photoresist formed thereabove, forming at least one sub-nominal grating structure in the layer of photoresist, wherein the sub-nominal grating structure is comprised of a plurality of photoresist features, and illuminating the formed sub-nominal grating structure. The method further comprises measuring light reflected off of the formed sub-nominal grating structure to generate an optical characteristic trace for the formed sub-nominal grating structure, comparing the generated optical characteristic trace for the formed sub-nominal grating structure to a target optical characteristic trace, and determining, based upon a comparison of the generated optical characteristic trace and the target optical characteristic trace, the presence of residual photoresist material between the features of the sub-nominal grating structure.

BRIEF DESCRIPTION OF THE DRAWINGS

The invention may be understood by reference to the following description taken in conjunction with the accompanying drawings, in which like reference numerals identify like elements, and in which.

Figure 1:
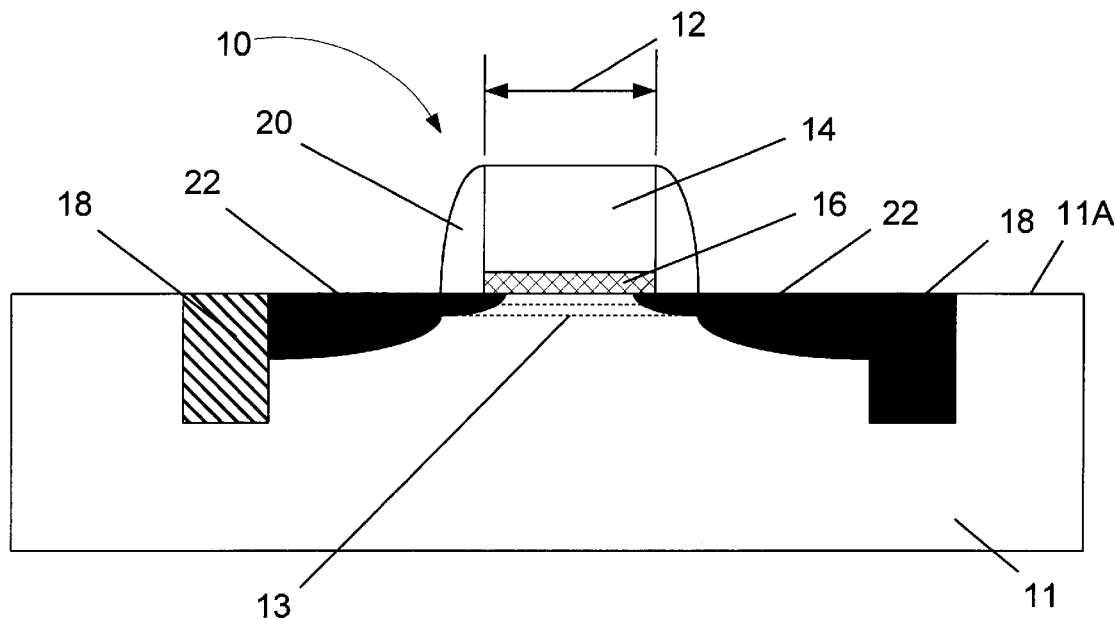
FIG. 1 is a cross-sectional view of an illustrative prior art transistor.
Figure 2A:
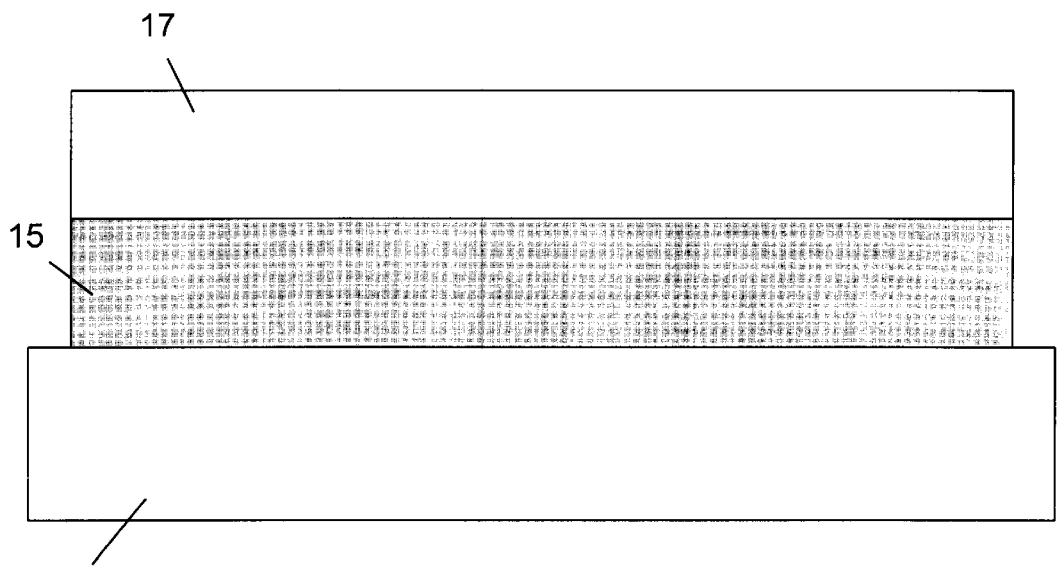
FIGS. 2A–2B are cross-sectional views of a process layer having a layer of photoresist formed thereabove.
Figure 2B:
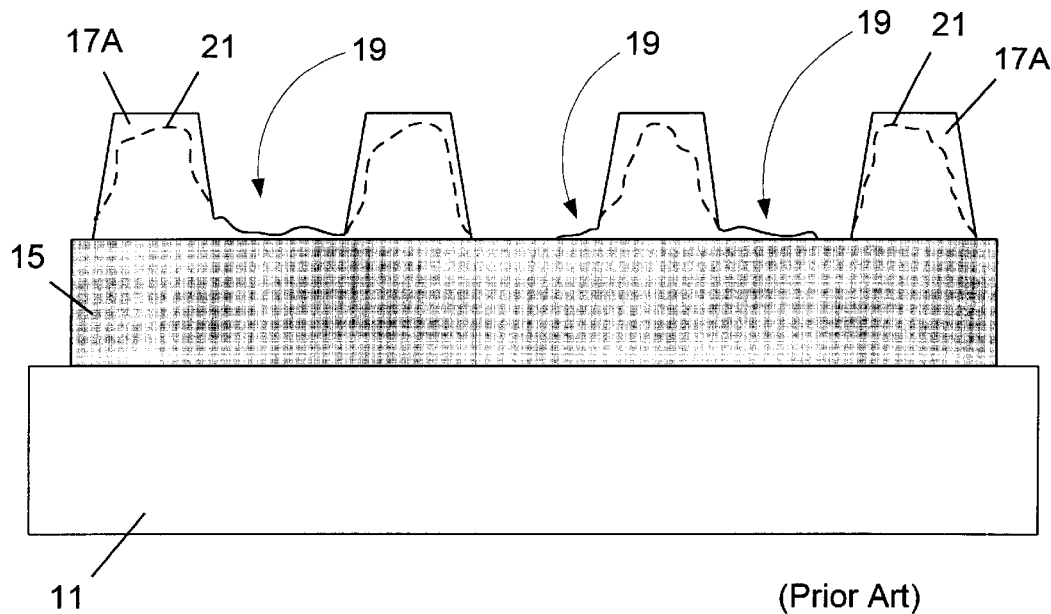

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to a method of controlling photolithography processes based upon scatterometric measurements of sub-nominal grating structures, and a system for accomplishing same. As will be readily apparent to those skilled in the art upon a complete reading of the present application, the present method is applicable to a variety of technologies, e.g, NMOS, PMOS, CMOS, etc., and it is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed using known photolithography and etching techniques until such time as a completed device is formed. Photolithography generally involves forming a patterned layer of photoresist material (positive or negative) above one or more layers of material that are desired to be patterned, and using the patterned photoresist layer as a mask in subsequent etching processes.

Figure 3A:
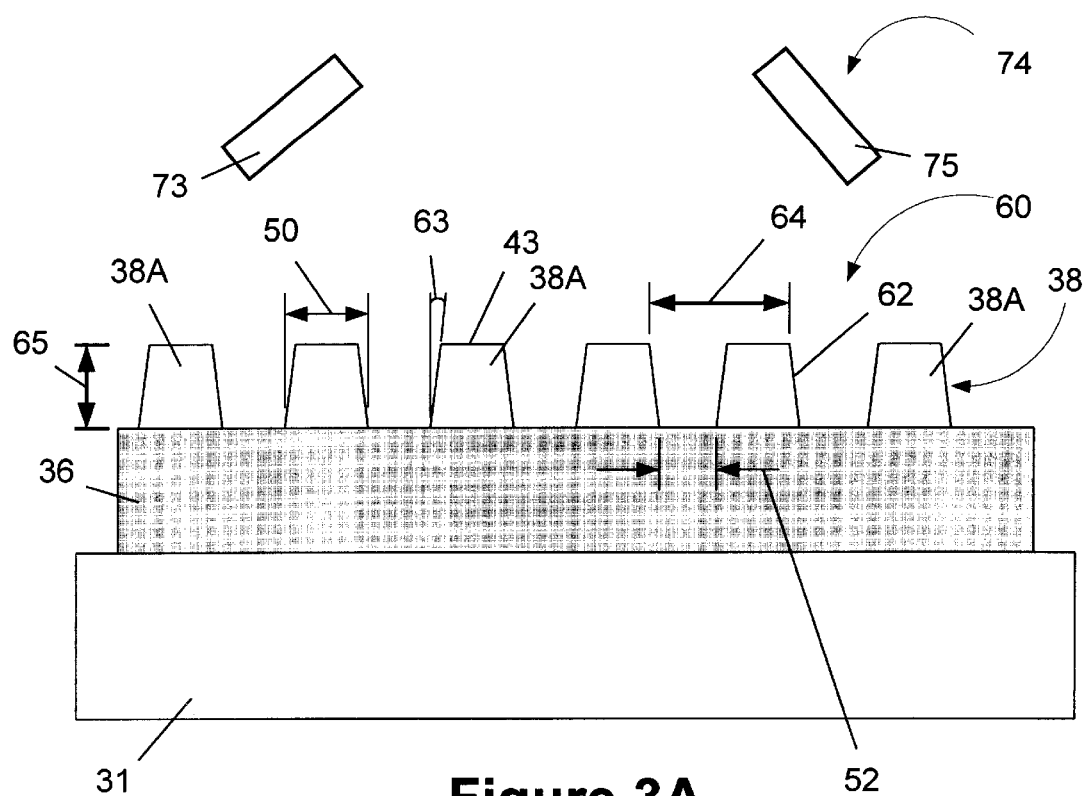
FIGS. 3A–3B depict one illustrative embodiment of a sub-nominal grating structure that may be employed with the present invention.
Figure 3B:
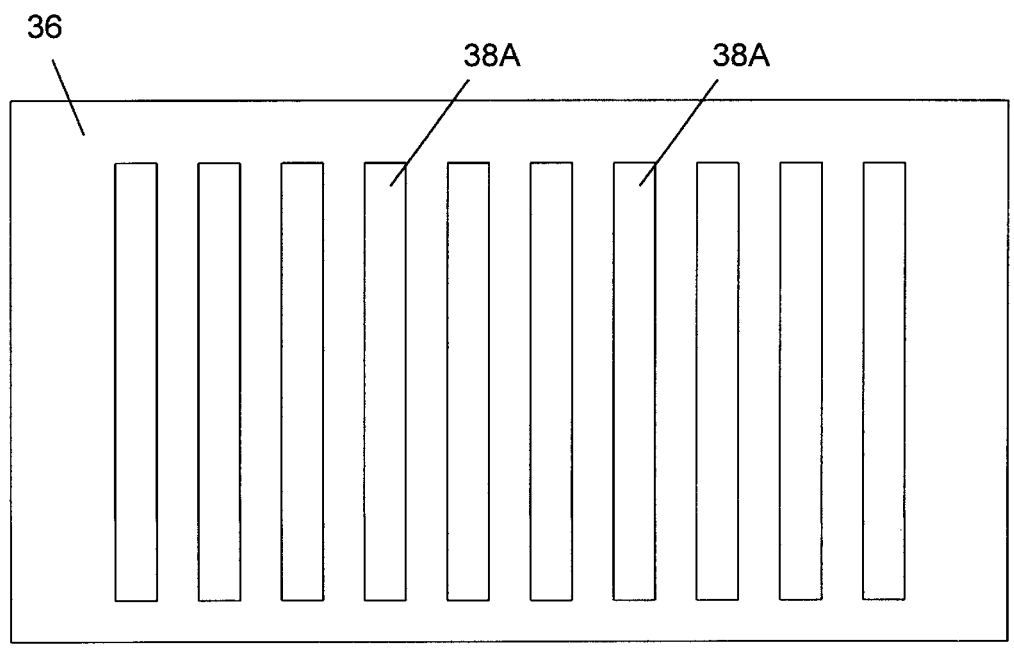

For example, as shown in FIGS. 3A–3B, a process layer 36 may be formed above a substrate 31 (or other previously-formed process layer), and a patterned layer of photoresist 38 is formed above the process layer 36. That is, in stating that the process layer 36 may be formed "above" the substrate 31, it should be understood that the process layer 36 may be formed on the substrate 31 as well as anywhere above one or more intervening layers. It is intended that the process layer 36 will ultimately be patterned using known photolithography and etching techniques. In the context of the present invention, the process layer 36 is intended to be representative of any type of process layer that may be patterned in semi-conductor manufacturing operations. For example, the process layer 36 may be comprised of polysilicon, a metal, e.g., aluminum, or an insulating material having a dielectric constant less than 5.0, such as silicon dioxide, silicon oxynitride, etc. Further, the process layer 36 to be patterned may be formed on a substrate 31 or over another process layer, e.g, a metal layer formed above a previously-formed layer of insulating material. Moreover, as will be clear to those skilled in the art, after a complete reading of this application, the present invention may be employed in a variety of situations encountered in semiconductor manufacturing. For example, the present invention may be employed in the context of forming gate electrode structures, conductive metal lines, openings in insulating layers, etc. Thus, the particular composition of the process layer 36 and the type of features formed in the process layer 36 should not be considered a limitation of the present invention unless such limitations are expressly set forth in the appended claims.

In general, the present invention involves forming one or more sub-nominal grating structures 60 (see FIGS. 3A–3B and FIG. 4) in the layer of photoresist 38 and determining the existence of residual photoresist material between the features comprising the sub-nominal grating structure 60. That is, the present invention provides a method for determining if photoresist scumming (either globally or locally) is present on the wafer, based upon scatterometric measurements of the sub-nominal grating structure 60. Moreover, in some embodiments, the results obtained using the present inventive methods may be used in controlling one or more parameters of subsequent photolithography operations used to form patterned layers of photoresist material on subsequently processed wafers.

The size, shape, and configuration of the sub-nominal grating structure 60 may be varied. For example, as shown in FIGS. 3A–3B, the sub-nominal grating structure 60 may be comprised of a plurality of photoresist features 38A, e.g., multiple lines or trenches, formed in the layer of photoresist 38. The term "sub-nominal grating structure" as used herein is to be understood to refer to a grating structure comprised of a plurality of photoresist features 38A wherein the critical dimension 50 of the photoresist features 38A and/or the spacing 52 between the features 38A is less than the critical dimension 54 and/or spacing 56 of photoresist features 38B formed in the layer of photoresist 38 that are used in forming actual production features in the underlying process layer 36 in production devices. See FIG. 4. That is, the sub-nominal grating structure 60 is comprised of a plurality of photoresist features 38A that have a critical dimension 50 and/or a spacing 52 between the photoresist features 38A that are less than corresponding dimensions and/or spacing for photoresist features 38B used in forming working integrated circuit devices in the production die 42 of the wafer 31. See FIG. 5.

Figure 4:
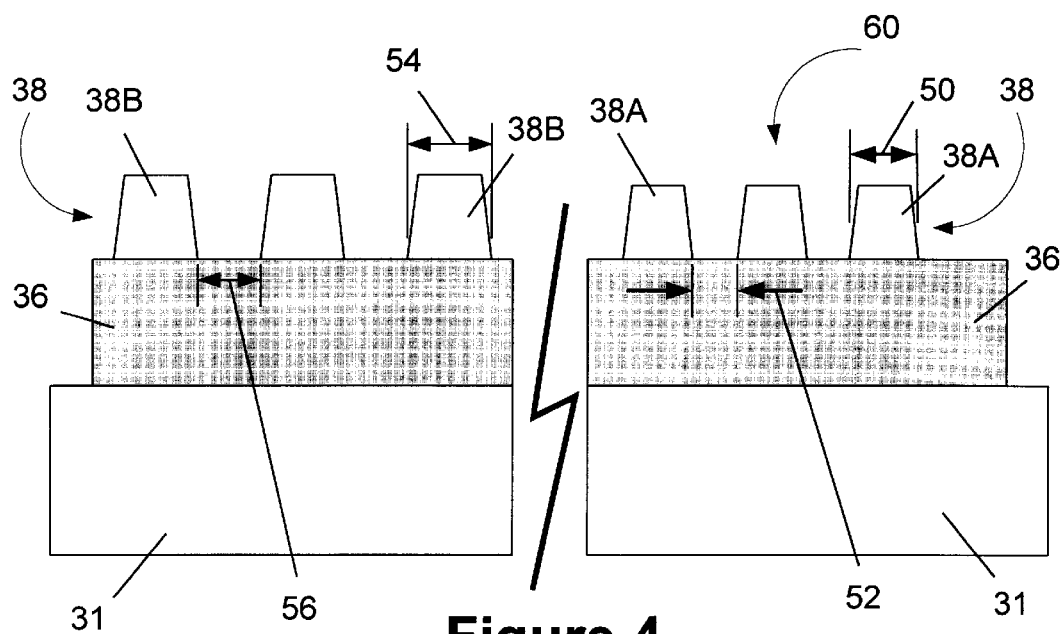
FIG. 4 depicts one illustrative sub-nominal grating structure as compared to other photoresist features that may be formed in the layer of photoresist.

For example, as shown in FIG. 4, in the case of forming a plurality of gate electrodes for production of integrated circuit devices, a plurality of photoresist features 38B having a critical dimension 54 of approximately 0.18 $\mu$m and a spacing 56 therebetween of approximately 0.72 $\mu$m may be formed above the process layer 36 comprised of polysilicon.

In the same layer of photoresist 38, a sub-nominal grating structure 60 may be formed, and it may be comprised of a plurality of photoresist features 38A having a critical dimension 50 of approximately 0.14–0.16 $\mu$m and a spacing 52 therebetween of approximately 0.54 $\mu$m. Photoresist scumming, or the presence of residual photoresist material between photoresist features, may be more readily detected in the sub-nominal grating structure 60 due to the fact that it is comprised of photoresist features 38B having a reduced feature size and/or reduced spacing between the photoresist features 38A. As a result, the present invention may be used to detect and indicate when problems are occurring in photolithography processes thereby resulting in photoresist scumming. Through use of the present invention, such scumming problems may be detected and hopefully corrected prior to the scumming adversely affecting the production of photoresist features to be used in forming production devices.

One such illustrative grating structure 60, depicted in FIGS. 3A–3B, is comprised of a plurality of photoresist features 38A, e.g., lines, formed in the layer of photoresist 38. The photoresist features 38A comprising the sub-nominal grating structure 60 have a thickness 65 and sidewalls 62 disposed at an angle 63 (relative to a line normal to the surface 43 of the layer of photoresist 38). The thickness 65, the sidewall angle 63, and the pitch 64 of the photoresist features 38A may be varied as a matter of design choice. For example, the sub-nominal grating structure 60 may be formed in regions having approximate dimensions of 100 μm×120 μm, and it may be comprised of approximately 300–400 photoresist features 38A (depending upon the selected pitch). The thickness 65 of the photoresist features 38A will generally correspond to the thickness of the layer of photoresist 38. The sidewall angle 63 of the photoresist features 38A may vary from approximately __–__ degrees, although this range should not be considered a limitation on the claimed invention unless specifically recited in an appended claim.

The sub-nominal grating structure 60 may be formed as a separate test structure that is formed in the layer of photoresist 38 in an area defined by a scribe line of a wafer 31. The photoresist features 38A that are part of the sub-nominal grating structure 60 may be formed at the same time that other photoresist features, e.g., features 38B, are being formed for production devices formed on the wafer 31. That is, a pattern for the sub-nominal grating structure 60 may be formed in a reticle that will be used in the process of exposing the layer of photoresist 38 to form production integrated circuit devices within the die 42. Alternatively, a separate reticle may be used wherein only the sub-nominal grating structures 60 are formed in the layer of photoresist 38. This separate reticle may be used before or after the reticle used to expose the production devices is used.

Figure 5:
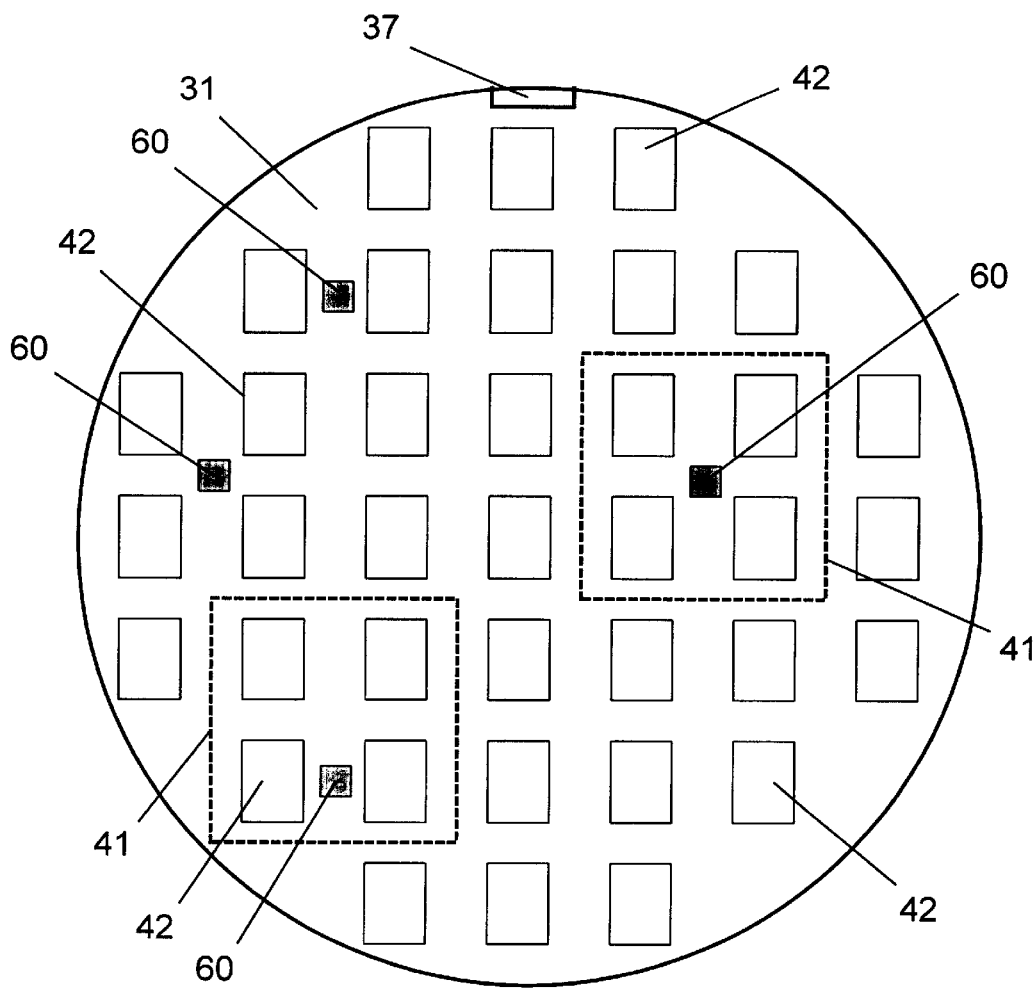
FIG. 5 is a plan view of an illustrative wafer depicting several production die and a plurality of grating structures formed above said wafer.

As shown in FIG. 5, a plurality of production die 42 are formed above the wafer 31. The die 42 define an area of the wafer 31 where production integrated circuit devices, e.g., microprocessors, ASICs, memory devices, etc., will be formed. The size, shape and number of die 42 per wafer 31 depend upon the type of device under construction. For example, several hundred die 42 may be formed above an 8-inch diameter wafer 31. The wafer 31 may also have an alignment notch 37 that is used to provide relatively rough alignment of the wafer 31 prior to performing certain processes, e.g, an exposure process in a stepper tool.

A stepper tool contains a light source (not shown) that is used to project light through a reticle (not shown) onto the layer of photoresist 38. Ultimately, the image in the reticle will be transferred to the layer of photoresist 38, and the underlying process layer 36 will be patterned using the patterned layer of photoresist 38 as a mask during one or more subsequent etching processes. The exposure process performed on the wafer 31 is typically performed on a flash-by-flash basis as the wafer 31 is moved, or stepped, relative to the light source within the stepper tool. During each step, the light source projects light onto a given area of the wafer 31, i.e., each flash is projected onto an exposure field 41 (indicated by dashed lines). The size of the exposure field 41, as well as the number of die 42 within each exposure field 41, may vary greatly. For example, an illustrative exposure field 41 is depicted in FIG. 4 wherein four of the die 42 fall within the exposure field 41, i.e., a so-called 2×2 pattern. However, the number of die 42 and size of the exposure field 41 may vary. For example, integrated circuits may be exposed using a 1×2 pattern (covering 2 die), a 5×5 pattern (covering 25 die), etc. The precise pattern of the exposure field 41 may be based upon the product under construction as well as the desires and judgment of the appropriate process engineer.

The sub-nominal grating structures 60 may be formed at the same time other photoresist features are being formed in the layer of photoresist 38 that will ultimately be used to define various features in the underlying process layer 36 in the area defined by the production die 42. Ultimately, these sub-nominal grating structures 60 will be measured using scatterometric techniques, and these measurements may be used to determine the presence of residual photoresist material, i.e., photoresist scumming. In further embodiments, these measurements may be used to control one or more parameters of photolithography processes used to form a patterned layer of photoresist on a subsequently processed wafer. Normally, these sub-nominal grating structures 60 will be formed in the layer of photoresist 38 above the space between the die 42, i.e., in the area defined by so-called scribe lines. The size of the scribe lines relative to the size of the die 42 in the attached figures is exaggerated for purposes of clarity. Alternatively, assuming there is available plot space, the sub-nominal grating structures 60 may be formed in the area defined by one or more of the die 42.

Figure 6:
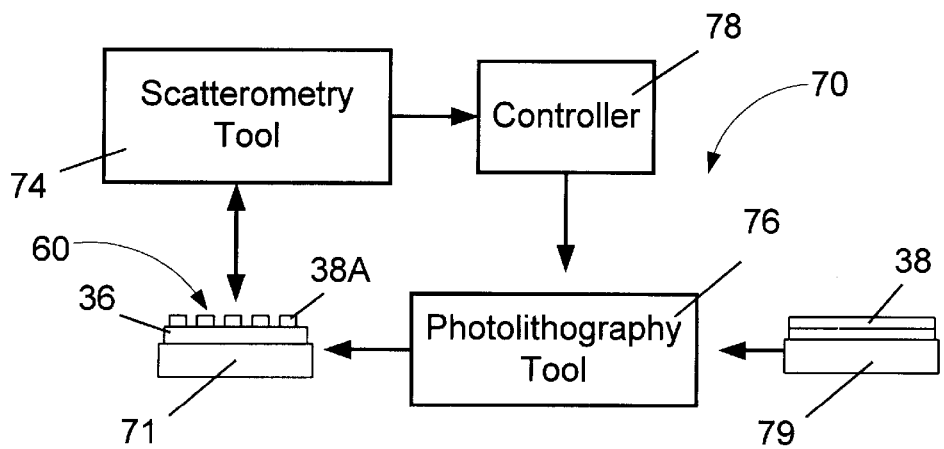
FIG. 6 depicts an illustrative embodiment of a system useful in practicing various embodiments of the present invention.

An illustrative system 70 that may be used in one embodiment of the present invention is shown in FIG. 6. The system 70 is comprised of a scatterometry tool 74, a photolithography tool 76, and a controller 78. As indicated in FIG. 6, the wafer 71 is representative of one or more wafers having a film stack comprised of at least one process layer and a layer of photoresist 38 formed thereabove. The wafer 71 is depicted at the point in the process wherein it has previously been processed in the photolithography tool 76. The layer of photoresist 38 on the wafer 71 was subjected to an exposure process in the stepper tool to transfer the features defined in the reticle (not shown) to the layer of photoresist 38. During this process, the at least one sub-nominal grating structure 60 was defined in the layer of photoresist 38, as were many other photoresist features that will be used to ultimately form production features in the underlying process layer 36. Ultimately, the layer of photoresist 38 will be subjected to a development process whereby soluble portions of the layer of photoresist 38 will be removed. This will result in the definition of a patterned layer of photoresist 38 that reflects the pattern in the reticle used during the exposure process. This patterned layer of photoresist 38 will be used in patterning the underlying process layer by performing one or more known etching processes.

An illustrative scatterometry tool 74 that may be used with the present invention is comprised of a representative light source 73 and a detector 75 depicted in FIG. 3A. Ultimately, the sub-nominal grating structure(s) 60 will be measured using scatterometric techniques, and these measurements will be used to determine presence of residual photoresist material between the photoresist features 38A comprising the sub-nominal grating structure 60. Stated another way, the scatterometry measurements can provide feedback as to the effectiveness and/or deterioration of the photolithography process.

A variety of scatterometry tools 74 may be used with the present invention, e.g., so-called 2θ-type systems and lens-type scatterometry tools. The scatterometry tool 74 may use white light, or some other wavelength or combination of wavelengths, depending on the specific implementation. Typically, the scatterometry tool 74 will generate an incident beam that has a wide spectral composition and wherein the intensity of the light changes slowly in comparison to changes in wavelength. The angle of incidence of the light may also vary, depending on the specific implementation.

The optical characteristic traces generated by the scatterometry tool 74 may be based upon a comparison of light intensity to wavelength (for white light, fixed angle type scatterometry tools) or a comparison of intensity to incident angle (for angle resolved systems that use a single light source). Additionally, the light source 73 and the detector 74 may be arranged in a concentric circle configuration, with the light source 73 illuminating the sub-nominal grating structure 60 from a perpendicular orientation, e.g, a reflectometer. The intensity of the reflected light may be measured as s- and p-polarization over either multiple angles or at multiple wavelengths.

In general, the scatterometry tool 74 (see FIG. 6) includes optical hardware, such as an ellipsometer or reflectometer, and a data processing unit loaded with a scatterometry software application for processing data collected by the optical hardware. For example, the optical hardware may include a Model OP5230 or OP5240 with a spectroscopic ellipsometer offered by Thermawave, Inc. of Fremont, Calif. The data processing unit may comprise a profile application server manufactured by Timbre Technologies, a fully owned subsidiary of Tokyo Electron America, Inc. of Austin, Tex. and distributed by Thermawave, Inc.

Through use of scatterometry, an optical characteristic trace for a sub-nominal grating structure 60, associated with a particular degree of photoresist scumming (including degradation of the profiles of the photoresist features 38A), may be calculated (using Maxwell's equations and rigorous coupled wave analysis (RCWA) ) for a vast variety of anticipated photoresist scumming situations. These traces may be stored in a library. Scatterometry libraries are commercially available from Timbre Technologies, Inc. The calculated scatterometry trace may be based on a variety of characteristics of the photoresist features 38A, e.g., lines or trenches, comprising the sub-nominal grating structure 60. For example, with reference to FIGS. 3A–3B, the optical characteristic trace may be based upon the side-wall angle 63 or critical dimension 50 of the photoresist features 38A. Other characteristics or combination of characteristics may also be used as the basis for the optical characteristic traces.

Variations in the amount of residual photoresist material and the associated profile degradations in the photoresist features 38A of the sub-nominal grating structure 60 will cause one or more of the optical characteristics of the sub-nominal grating structure 60 to vary. In turn, this will cause a significant change in the diffraction characteristics of the incident light from the light source 73 of the scatterometry tool 74. Thus, using Maxwell's equations, a unique optical characteristic trace may be established for a variety of anticipated situations reflecting unwanted photoresist scumming. A library of traces corresponding to each anticipated situation may be calculated and stored in a library. Through this technique, each trace in the library represents a sub-nominal grating structure 60 comprised of photoresist features having a known degree or presence of unwanted residual photoresist material.

The present invention may be employed to correlate or match a measured or generated trace of a sub-nominal grating structure 60 comprised of a plurality of photoresist features 38A having an unknown degree of photoresist scumming to a library of such traces, each of which corresponds to a sub-nominal grating structure 60 having a known degree of photoresist scumming. That is, in one embodiment, the scatterometry tool 74 is used to measure and generate a trace for a given grating structure 60 comprised of a plurality of photoresist features 38A formed in a layer of photoresist 38 having an unknown degree or amount of residual photoresist material positioned between the features 38A. The scatterometry tool 74 may measure one or more formed sub-nominal grating structures 60 in one or more exposure fields 41 on a given wafer. Moreover, the traces from a sample of the sub-nominal grating structures 60 may be averaged or otherwise statistically analyzed. The scatterometry tool 74 (or some other controller resident within the manufacturing plant, e.g., controller 78) compares the measured trace (i.e., individual or averaged) to a library of traces with known degrees of residual photoresist material to correlate or approximately match the current measured trace with a trace in the library. When a match is confirmed, the scatterometry tool 74 (or other controller) may then provide data as to the presence and/or amount or degree of residual photoresist material positioned between the features 38A of the formed sub-nominal grating structure 60.

Based upon these comparisons, the completeness and/or deterioration of the photolithography process used to form the sub-nominal grating structure 60, and other photoresist features, may be determined, analyzed, or evaluated. For example, if the matching of the generated optical characteristic trace for the sub-nominal grating structure 60 indicates the presence of unwanted photoresist material, the photolithography process may be discontinued until such time as the cause of the photoresist scumming process can be identified and corrected. By way of example, it may be the case that the light source (not shown) within the stepper has gradually degraded over time to the point that it no longer provides the same exposure dose, even though settings on the stepper tool indicate that it should. In this situation, the light source may be replaced prior to performing additional exposures processes on additional wafers. The measurement of the sub-nominal grating structure 60 provides feedback as to the effectiveness and possible degradation of the photolithography process prior to it becoming an issue with respect to the formation of the larger photoresist features in production areas of the wafer.

Additionally, based upon the determined degree of residual photoresist material, the controller 78, if needed, may adjust one or more parameters of the photolithography processes used to form a patterned layer of photoresist on subsequently processed wafers 79. See FIG. 6. For example, the results of the scatterometric measurement of the sub-nominal grating structure 60 may be fed back to the controller 78. In turn, the controller 78 may modify or determine one or more process parameters for forming a patterned layer of photoresist above a subsequently processed wafer. Various parameters may be controlled using the present techniques, e.g., the exposure dose of a stepper exposure process, the focus of the stepper exposure process, the duration of the subsequent development process, post exposure bake time and/or temperature, etc. A variety of other parameters or combination of parameters may also be varied.

In another embodiment, the measured or generated trace of the sub-nominal grating structure 60 may be compared to a target trace selected from the library for a sub-nominal grating structure 60 comprised of photoresist features having a known, or at least acceptable, degree of residual photoresist material. For example, a target trace may be calculated for a sub-nominal grating structure 60 comprised of photoresist features 38A having an ideal or acceptable degree of photoresist scumming using Maxwell's equations, and that target trace may be stored in the library. Thereafter, a measured trace of a sub-nominal grating structure 40 comprised of photoresist features 38A having an unknown degree of photoresist scumming is compared to the target trace. Based upon this comparison, it may be determined if the photolithography process is producing patterned layers of photoresist 38 that have acceptable characteristics. Using this technique, a determination may be made as to the acceptability of the patterned layer of photoresist 38, as well as the effectiveness of the photolithography process. Of course, this step may be performed in addition to the matching or correlating of a measured trace to a trace from the library as described above.

In another illustrative embodiment, the present invention is directed to a system 70 adapted for use with the inventive methods disclosed herein. In one embodiment, the system 70 is comprised of a scatterometry tool 74 that is adapted to illuminate a sub-nominal grating structure 60 formed in a layer of photoresist 38, measure light reflected off of the illuminated sub-nominal grating structure 60, generate an optical characteristic trace for the sub-nominal grating structure 60, and compare the generated optical characteristic trace to an optical characteristic trace stored in a library in the system 70. The system 70 further comprises a controller 78 that, based upon the comparison of the generated optical characteristic trace and at least one trace from the library, may adjust a parameter of a photolithography process to be performed on at least one subsequently processed wafer.

Control equations may be employed to adjust the operating recipe of the photolithography tool 76 in situations where the methods described herein indicate that an adjustment is warranted. The control equations may be developed empirically using commonly known linear or non-linear techniques. The controller 78 may automatically control the operating recipes of the photolithography tool 76 used to form a layer of photoresist on the subsequently processed wafers 79. Through use of the present invention, the extent and magnitude of variations in photolithography processes used to form patterned layers of photoresist may be reduced.

In the illustrated embodiments, the controller 78 is a computer programmed with soft-ware to implement the functions described herein. Moreover, the functions described for the controller 78 may be performed by one or more controllers spread through the system. For example, the controller 78 may be a fab level controller that is used to control processing operations throughout all or a portion of a semiconductor manufacturing facility. Alternatively, the controller 78 may be a lower level computer that controls only portions or cells of the manufacturing facility. Moreover, the controller 78 may be a stand-alone device, or it may reside on the etch tool 76. However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be understood, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 78, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI.

The present invention is directed to a method of controlling photolithography processes based upon scatterometric measurements of sub-nominal grating structures, and a system for accomplishing same. In one illustrative embodiment, the method comprises providing a library of optical characteristic traces, each of which corresponds to a sub-nominal grating structure 60 comprised of a plurality of photoresist features 38A having a known degree of residual photoresist material positioned between the features, forming a process layer 36 above a semiconducting substrate, and forming a layer of photoresist 38 above the process layer 36. The method further comprises forming at least one sub-nominal grating structure 60 in the layer of photoresist 38, the sub-nominal grating structure 60 being comprised of a plurality of photoresist features 38A, illuminating the formed sub-nominal grating structure 60, measuring light reflected off of the formed sub-nominal grating structure 60 to generate an optical characteristic trace for the formed sub-nominal grating structure, and determining the presence of residual photoresist material between the features 38A of the formed sub-nominal grating structure 60 by comparing the generated optical characteristic trace to at least one optical characteristic trace from the library.

In another illustrative embodiment, the method comprises providing a wafer 31 having at least one process layer 36 and a layer of photoresist 38 formed thereabove, forming at least one sub-nominal grating structure 60 in the layer of photoresist 38, wherein the sub-nominal grating structure 60 is comprised of a plurality of photoresist features 38A, and illuminating the formed sub-nominal grating structure 60. The method further comprises measuring light reflected off of the formed sub-nominal grating structure 60 to generate an optical characteristic trace for the formed sub-nominal grating structure 60, comparing the generated optical characteristic trace for the formed sub-nominal grating structure 60 to a target optical characteristic trace, and determining, based upon a comparison of the generated optical characteristic trace and the target optical characteristic trace, the presence of residual photoresist material between the features 38A of the sub-nominal grating structure 60.

The present invention is also directed to a system for accomplishing the illustrative methods described herein. In one embodiment, the system 70 is comprised of a scatterometry tool 74, a photolithography tool 76 and a controller 78. The scatterometry tool 74 is adapted to make scatterometric measurements of a grating structure 60 comprised of a plurality of photoresist features having an unknown thickness and generate an optical characteristic trace for the grating structure 60. The scatterometry tool 74 may be further used to compare the generated optical characteristic trace to an optical characteristic trace from a library containing a plurality of traces or to correlate or match the generated optical characteristic trace to an optical trace in the library. The controller 78 may then be used to control one or more parameters of one or more processes used the form a layer of photoresist on subsequently processed wafers.

Through use of the present invention, better process control may be achieved in modern integrated circuit manufacturing facilities. More particularly, the present invention may enable more precise control of photolithography processes employed in manufacturing integrated circuit devices, thereby improving device performance and increasing production yields.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
providing a library of optical characteristic traces, each of which corresponds to a sub-nominal grating structure comprised of a plurality of photoresist features having a known degree of residual photoresist material positioned between said photoresist features;
forming a process layer above a semiconducting substrate;
forming a layer of photoresist above said process layer;
forming at least one sub-nominal grating structure in said layer of photoresist, said sub-nominal grating structure being comprised of a plurality of photoresist features;
illuminating said formed sub-nominal grating structure;
measuring light reflected off of said formed sub-nominal grating structure to generate an optical characteristic trace for said formed sub-nominal grating structure; and
determining the presence of residual photoresist material between said features of said formed sub-nominal grating structure by comparing said generated optical characteristic trace to at least one optical characteristic trace from said library.

2. The method of claim 1, further comprising modifying at least one parameter of a photolithography process used to form a patterned layer of photoresist on at least one subsequently processed wafer based upon said determined presence of residual photoresist material between said photoresist features of said sub-nominal grating structure.

3. The method of claim 1, wherein forming at least one sub-nominal grating structure in said layer of photoresist comprises forming a plurality of sub-nominal grating structures in said layer of photoresist.

4. The method of claim 2, wherein modifying at least one parameter of a photolithography process used to form a patterned layer of photoresist on at least one subsequently processed wafer comprises modifying at least one of a stepper exposure dose, a stepper focus, and a duration of a photoresist development process.

5. The method of claim 1, wherein forming at least one sub-nominal grating structure in said layer of photoresist comprises forming at least one sub-nominal grating structure in said layer of photoresist above a scribe line of said wafer.

6. The method of claim 1, wherein said photoresist features comprising said formed sub-nominal grating structure are comprised of lines or trenches.

7. The method of claim 1, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a critical dimension that is less than a critical dimension of additional photoresist features formed in said layer of photoresist, said additional photoresist features to be used as a mask in etching production features in an integrated circuit device.

8. The method of claim 1, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a spacing that is less than a spacing of additional photoresist features formed in said layer of photoresist, said additional photoresist features to be used as a mask in etching production features in an integrated circuit device.

9. The method of claim 1, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a critical dimension and a spacing that is less than a critical dimension and a spacing of additional photoresist features formed in said layer of photoresist, said additional photoresist features to be used as a mask in etching production features in an integrated circuit device.

10. The method of claim 1, wherein forming a process layer comprises forming a process layer comprised of at least one of a metal, polysilicon and an insulating material having a dielectric constant less than 5.0.

11. The method of claim 1, wherein forming a layer of photoresist above said process layer comprises forming a layer of positive or negative photoresist above said process layer.

12. A method, comprising:
providing a library of optical characteristic traces, each of which corresponds to a sub-nominal grating structure comprised of a plurality of photoresist features having a known degree of residual photoresist material positioned between said photoresist features;
forming a process layer above a semiconducting substrate, said process layer comprised of at least one of a metal, polysilicon, and a material having a dielectric constant less than 5.0;
forming a layer of photoresist above said process layer;
forming at least one sub-nominal grating structure in said layer of photoresist above a scribe line of a wafer, said sub-nominal grating structure being comprised of a plurality of photoresist features;

illuminating said formed sub-nominal grating structure;

measuring light reflected off of said formed sub-nominal grating structure to generate an optical characteristic trace for said formed sub-nominal grating structure;

determining the presence of residual photoresist material between said features of said formed sub-nominal grating structure by comparing said generated optical characteristic trace to at least one optical characteristic trace from said library; and modifying at least one parameter of a photolithography process used to form a patterned layer of photoresist on at least one subsequently processed wafer based upon said determined presence of residual photoresist material between said photoresist features of said sub-nominal grating structure.

13. The method of claim 12, wherein forming at least one sub-nominal grating structure in said layer of photoresist comprises forming a plurality of sub-nominal grating structures in said layer of photoresist.

14. The method of claim 12, wherein modifying at least one parameter of a photolithography process used to form a patterned layer of photoresist on at least one subsequently processed wafer comprises modifying at least one of a stepper exposure dose, a stepper focus, and a duration of a photoresist development process.

15. The method of claim 12, wherein said photoresist features comprising said formed sub-nominal grating structure are comprised of lines or trenches.

16. The method of claim 12, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a critical dimension that is less than a critical dimension of additional photoresist features formed in said layer of photoresist, said additional photoresist features to be used as a mask in etching production features in an integrated circuit device.

17. The method of claim 12, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a spacing that is less than a spacing of additional photoresist features formed in said layer of photoresist, said additional photoresist features to be used as a mask in etching production features in an integrated circuit device.

18. The method of claim 12, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a critical dimension and a spacing that is less than a critical dimension and a spacing of additional photoresist features formed in said layer of photoresist, said additional photoresist features to be used as a mask in etching production features in an integrated circuit device.

19. The method of claim 12, wherein forming a layer of photoresist above said process layer comprises forming a layer of positive or negative photoresist above said process layer.

20. A method, comprising:

providing a library of optical characteristic traces, each of which corresponds to a sub-nominal grating structure comprised of a plurality of photoresist features having a known degree of residual photoresist material positioned between said photoresist features;

forming a process layer above a semiconducting substrate;

forming a layer of photoresist above said process layer;

forming at least one sub-nominal grating structure in said layer of photoresist, said sub-nominal grating structure being comprised of a plurality of photoresist features that have a critical dimension that is less than a critical dimension of additional photoresist features formed in said layer of photoresist, said additional photoresist features to be used as a mask in etching production features in an integrated circuit device;

illuminating said formed sub-nominal grating structure;

measuring light reflected off of said formed sub-nominal grating structure to generate an optical characteristic trace for said formed sub-nominal grating structure;

determining the presence of residual photoresist material between said features of said formed sub-nominal grating structure by comparing said generated optical characteristic trace to at least one optical characteristic trace from said library; and modifying at least one parameter of a photolithography process used to form a patterned layer of photoresist on at least one subsequently processed wafer based upon said determined presence of residual photoresist material between said photoresist features of said sub-nominal grating structure.

21. The method of claim 20, wherein forming at least one sub-nominal grating structure in said layer of photoresist comprises forming a plurality of sub-nominal grating structures in said layer of photoresist.

22. The method of claim 20, wherein modifying at least one parameter of a photolithography process used to form a patterned layer of photoresist on at least one subsequently processed wafer comprises modifying at least one of a stepper exposure dose, a stepper focus, and a duration of a photoresist development process.

23. The method of claim 20, wherein forming at least one sub-nominal grating structure in said layer of photoresist comprises forming at least one sub-nominal grating structure in said layer of photoresist above a scribe line of said wafer.

24. The method of claim 20, wherein said photoresist features comprising said formed sub-nominal grating structure are comprised of lines or trenches.

25. The method of claim 20, further comprising forming said at least one sub-nominal grating structure in said layer of photoresist such that said plurality of photoresist features of said sub-nominal grating structure have a spacing that is less than a spacing of additional photoresist features formed in said layer of photoresist, said additional photoresist features to be used as a mask in etching production features in an integrated circuit device.

26. The method of claim 20, wherein forming a process layer comprises forming a process layer comprised of at least one of a metal, polysilicon and an insulating material having a dielectric constant less than 5.0.

27. The method of claim 20, wherein forming a layer of photoresist above said process layer comprises forming a layer of positive or negative photoresist above said process layer.

28. A method, comprising:

provide a library of optical characteristic traces, each of which corresponds to a sub-nominal grating structure comprised of a plurality of photoresist features having a known degree of residual photoresist material positioned between said photoresist features;

forming a process layer above a semiconducting substrate;

forming a layer of photoresist above said process layer;

forming at least one sub-nominal grating structure in said layer of photoresist, said sub-nominal grating structure being comprised of a plurality of photoresist features that have a spacing that is less than a spacing of additional photoresist features formed in said layer of photoresist, said additional photoresist features to be used as a mask in etching production features in an integrated circuit device;

illuminating said formed sub-nominal grating structure;

measuring light reflected off of said formed sub-nominal grating structure to generate an optical characteristic trace for said formed sub-nominal grating structure;

determining the presence of residual photoresist material between said features of said formed sub-nominal grating structure by comparing said generated optical characteristic trace to at least one optical characteristic trace from said library; and modifying at least one parameter of a photolithography process used to form a patterned layer of photoresist on at least one subsequently processed wafer based upon said determined presence of residual photoresist material between said photoresist features of said sub-nominal grating structure.

29. The method of claim 28, wherein forming at least one sub-nominal grating structure in said layer of photoresist comprises forming a plurality of sub-nominal grating structures in said layer of photoresist.

30. The method of claim 28, wherein modifying at least one parameter of a photolithography process used to form a patterned layer of photoresist on at least one subsequently processed wafer comprises modifying at least one of a stepper exposure dose, a stepper focus, and a duration of a photoresist development process.

31. The method of claim 28, wherein forming at least one sub-nominal grating structure in said layer of photoresist comprises forming at least one sub-nominal grating structure in said layer of photoresist above a scribe line of said wafer.

32. The method of claim 28, wherein said photoresist features comprising said formed sub-nominal grating structure are comprised of lines or trenches.

33. The method of claim 28, further comprising forming said at least one sub-nominal grating structure in said layer of photoresist such that said plurality of photoresist features of said sub-nominal grating structure have a critical dimension that is less than a critical dimension of additional photoresist features formed in said layer of photoresist, said additional photoresist features to be used as a mask in etching production features in an integrated circuit device.

34. The method of claim 28, wherein forming a process layer comprises forming a process layer comprised of at least one of a metal, polysilicon and an insulating material having a dielectric constant less than 5.0.

35. The method of claim 28, wherein forming a layer of photoresist above said process layer comprises forming a layer of positive or negative photoresist above said process layer.

36. A method, comprising:

providing a library of optical characteristic traces, each of which corresponds to a sub-nominal grating structure comprised of a plurality of photoresist features having a known degree of residual photoresist material positioned between said photoresist features;

forming a process layer above a semiconducting substrate;

forming a layer of photoresist above said process layer;

forming at least one sub-nominal grating structure in said layer of photoresist above a scribe line of a wafer, said sub-nominal grating structure being comprised of a plurality of photoresist features;

illuminating said formed sub-nominal grating structure;

measuring light reflected off of said formed sub-nominal grating structure to generate an optical characteristic trace for said formed sub-nominal grating structure;

determining the presence of residual photoresist material between said features of said formed sub-nominal grating structure by comparing said generated optical characteristic trace to at least one optical characteristic trace from said library; and modifying at least one parameter of a photolithography process used to form a patterned layer of photoresist on at least one subsequently processed wafer based upon said determined presence of residual photoresist material between said photoresist features of said sub-nominal grating structure.

37. The method of claim 36, wherein forming at least one sub-nominal grating structure in said layer of photoresist comprises forming a plurality of sub-nominal grating structures in said layer of photoresist, each of which are formed above a scribe line of a wafer.

38. The method of claim 36, wherein modifying at least one parameter of a photolithography process used to form a patterned layer of photoresist on at least one subsequently processed wafer comprises modifying at least one of a stepper exposure dose, a stepper focus, and a duration of a photoresist development process.

39. The method of claim 36, wherein said photoresist features comprising said formed sub-nominal grating structure are comprised of lines or trenches.

40. The method of claim 36, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a critical dimension that is less than a critical dimension of additional photoresist features formed in said layer of photoresist, said additional photoresist features to be used as a mask in etching production features in an integrated circuit device.

41. The method of claim 36, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a spacing that is less than a spacing of additional photoresist features formed in said layer of photoresist, said additional photoresist features to be used as a mask in etching production features in an integrated circuit device.

42. The method of claim 36, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a critical dimension and a spacing that is less than a critical dimension and a spacing of additional photoresist features formed in said layer of photoresist, said additional photoresist features to be used as a mask in etching production features in an integrated circuit device.

43. The method of claim 36, wherein forming a process layer comprises forming a process layer comprised of at least one of a metal, polysilicon and an insulating material having a dielectric constant less than 5.0.

44. The method of claim 36, wherein forming a layer of photoresist above said process layer comprises forming a layer of positive or negative photoresist above said process layer.

45. A method, comprising:
providing a wafer having at least one process layer and a layer of photoresist formed thereabove;
forming at least one sub-nominal grating structure in said layer of photoresist, said sub-nominal grating structure being comprised of a plurality of photoresist features;
illuminating said formed sub-nominal grating structure;
measuring light reflected off of said formed sub-nominal grating structure to generate an optical characteristic trace for said formed sub-nominal grating structure;
comparing the generated optical characteristic trace for said formed sub-nominal grating structure to a target optical characteristic trace; and
determining, based upon a comparison of said generated optical characteristic trace and said target optical characteristic trace, the presence of residual photoresist material between said features of said formed sub-nominal grating structure.

46. The method of claim 45, wherein providing a wafer having at least one process layer and a layer of photoresist formed thereabove comprises providing a wafer having at least one process layer and a layer of photoresist formed thereabove, said layer of photoresist being comprised of either a negative or positive photoresist material.

47. The method of claim 45, wherein forming at least one sub-nominal grating structure in said layer of photoresist comprises forming at least one sub-nominal grating structure in said layer of photoresist above a scribe line of said wafer.

48. The method of claim 45, wherein forming at least one sub-nominal grating structure in said layer of photoresist comprises forming a plurality of sub-nominal grating structures in said layer of photoresist.

49. The method of claim 45, further comprising modifying, based upon a comparison of said generated optical characteristic trace and said target optical characteristic trace, at least one parameter of a photolithography process used to form a patterned layer of photoresist on a subsequently processed wafer.

50. The method of claim 49, wherein modifying at least one parameter of a photolithography process used to form a layer of photoresist on at least one subsequently processed wafer comprises modifying at least one of a stepper exposure dose, a stepper focus, and a duration of a photoresist development process.

51. The method of claim 45, wherein measuring the reflected light comprises measuring the intensity of the reflected light.

52. The method of claim 45, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a critical dimension that is less than a critical dimension of additional photoresist features formed in said layer of photoresist, said additional photoresist features to be used as a mask in etching production features in an integrated circuit device.

53. The method of claim 45, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a spacing that is less than a spacing of additional photoresist features formed in said layer of photoresist, said additional photoresist features to be used as a mask in etching production features in an integrated circuit device.

54. The method of claim 45, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a critical dimension and a spacing that is less than a critical dimension and a spacing of additional photoresist features formed in said layer of photoresist, said additional photoresist features to be used as a mask in etching production features in an integrated circuit device.

55. The method of claim 45, wherein forming a process layer comprises forming a process layer comprised of at least one of a metal, polysilicon and an insulating material having a dielectric constant less than 5.0.

56. The method of claim 45, wherein forming a layer of photoresist above said process layer comprises forming a layer of positive or negative photoresist above said process layer.

57. A method, comprising:
providing a wafer having at least one process layer and a layer of photoresist formed thereabove;
forming at least one sub-nominal grating structure in said layer of photoresist above a scribe line of said wafer, said sub-nominal grating structure being comprised of a plurality of photoresist features;
illuminating said formed sub-nominal grating structure;
measuring light reflected off of said formed sub-nominal grating structure to generate an optical characteristic trace for said formed sub-nominal grating structure;
comparing the generated optical characteristic trace for said formed sub-nominal grating structure to a target optical characteristic trace; and
modifying, based upon a comparison of said generated optical characteristic trace and said target optical characteristic trace, at least one parameter of a photolithography process used to form a patterned layer of photoresist on a subsequently processed wafer.

58. The method of claim 57, wherein providing a wafer having at least one process layer and a layer of photoresist formed thereabove comprises providing a wafer having at least one process layer and a layer of photoresist formed thereabove, said layer of photoresist being comprised of either a negative or positive photoresist material.

59. The method of claim 57, wherein forming at least one sub-nominal grating structure in said layer of photoresist comprises forming a plurality of sub-nominal grating structures in said layer of photoresist.

60. The method of claim 57, wherein modifying at least one parameter of a photolithography process used to form a layer of photoresist on at least one subsequently processed wafer comprises modifying at least one of a stepper exposure dose, a stepper focus, and a duration of a photoresist development process.

61. The method of claim 57, wherein measuring the reflected light comprises measuring the intensity of the reflected light.

62. The method of claim 57, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a critical dimension that is less than a critical dimension of additional photoresist features formed in said layer of photoresist, said additional photoresist features to be used as a mask in etching production features in an integrated circuit device.

63. The method of claim 57, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a spacing that is less than a spacing of additional photoresist features formed in said layer of photoresist, said additional photoresist features to be used as a mask in etching production features in an integrated circuit device.

64. The method of claim 57, wherein forming at least one sub-nominal grating structure in said layer of photoresist, said sub-nominal grating structure being comprised of a plurality of photoresist features, comprises forming at least one sub-nominal grating structure in said layer of photoresist, said sub-nominal grating structure being comprised of a plurality of photoresist features having a critical dimension and a spacing that is less than a critical dimension and a spacing of additional photoresist features formed in said layer of photoresist, said additional photoresist features to be used as a mask in etching production features in an integrated circuit device.

65. The method of claim 57, wherein forming a process layer comprises forming a process layer comprised of at least one of a metal, polysilicon and an insulating material having a dielectric constant less than 5.0.

66. The method of claim 57, wherein forming a layer of photoresist above said process layer comprises forming a layer of positive or negative photoresist above said process layer.

67. A method, comprising:
    providing a wafer having at least one process layer and a layer of photoresist formed thereabove;
    forming at least one sub-nominal grating structure in said layer of photoresist, said sub-nominal grating structure being comprised of a plurality of photoresist features that have a critical dimension that is less than a critical dimension of additional photoresist features formed in said layer of photoresist, said additional photoresist features to be used as a mask in etching production features in an integrated circuit device;
    illuminating said formed sub-nominal grating structure;
    measuring light reflected off of said formed sub-nominal grating structure to generate an optical characteristic trace for said formed sub-nominal grating structure;
    comparing the generated optical characteristic trace for said formed sub-nominal grating structure to a target optical characteristic trace;
    determining, based upon a comparison of said generated optical characteristic trace and said target optical characteristic trace, the presence of residual photoresist material between said features of said sub-nominal grating structure; and
    modifying, based upon a comparison of said generated optical characteristic trace and said target optical characteristic trace, at least one parameter of a photolithography process used to form a patterned layer of photoresist on a subsequently processed wafer.

68. The method of claim 67, wherein providing a wafer having at least one process layer and a layer of photoresist formed thereabove comprises providing a wafer having at least one process layer and a layer of photoresist formed thereabove, said layer of photoresist being comprised of either a negative or positive photoresist material.

69. The method of claim 67, wherein forming at least one sub-nominal grating structure in said layer of photoresist comprises forming at least one sub-nominal grating structure in said layer of photoresist above a scribe line of said wafer.

70. The method of claim 67, wherein forming at least one sub-nominal grating structure in said layer of photoresist comprises forming a plurality of sub-nominal grating structures in said layer of photoresist.

71. The method of claim 67, wherein modifying at least one parameter of a photolithography process used to form a layer of photoresist on at least one subsequently processed wafer comprises modifying at least one of a stepper exposure dose, a stepper focus, and a duration of a photoresist development process.

72. The method of claim 67, wherein measuring the reflected light comprises measuring the intensity of the reflected light.

73. The method of claim 67, further comprising forming said at least one sub-nominal grating structure in said layer of photoresist such that said plurality of photoresist features have a spacing that is less than a spacing of additional photoresist features formed in said layer of photoresist, said additional photoresist features to be used as a mask in etching production features in an integrated circuit device.

74. The method of claim 67, wherein forming a process layer comprises forming a process layer comprised of at least one of a metal, polysilicon and an insulating material having a dielectric constant less than 5.0.

75. The method of claim 67, wherein forming a layer of photoresist above said process layer comprises forming a layer of positive or negative photoresist above said process layer.

76. A method, comprising:
    providing a wafer having at least one process layer and a layer of photoresist formed thereabove;
    forming at least one sub-nominal grating structure in said layer of photoresist, said sub-nominal grating structure being comprised of a plurality of photoresist features that have a spacing that is less than a spacing of additional photoresist features formed in said layer of photoresist, said additional photoresist features to be used as a mask in etching production features in an integrated circuit device;
    illuminating said formed sub-nominal grating structure;
    measuring light reflected off of said formed sub-nominal grating structure to generate an optical characteristic trace for said formed sub-nominal grating structure;

comparing the generated optical characteristic trace for said formed sub-nominal grating structure to a target optical characteristic trace;

determining, based upon a comparison of said generated optical characteristic trace and said target optical characteristic trace, the presence of residual photoresist material between said features of said sub-nominal grating structure; and modifying, based upon a comparison of said generated optical characteristic trace and said target optical characteristic trace, at least one parameter of a photolithography process used to form a patterned layer of photoresist on a subsequently processed wafer.

77. The method of claim 76, wherein providing a wafer having at least one process layer and a layer of photoresist formed thereabove comprises providing a wafer having at least one process layer and a layer of photoresist formed thereabove, said layer of photoresist being comprised of either a negative or positive photoresist material.

78. The method of claim 76, wherein forming at least one sub-nominal grating structure in said layer of photoresist comprises forming at least one sub-nominal grating structure in said layer of photoresist above a scribe line of said wafer.

79. The method of claim 76, wherein forming at least one sub-nominal grating structure in said layer of photoresist comprises forming a plurality of sub-nominal grating structures in said layer of photoresist.

80. The method of claim 76, wherein modifying at least one parameter of a photolithography process used to form a layer of photoresist on at least one subsequently processed wafer comprises modifying at least one of a stepper exposure dose, a stepper focus, and a duration of a photoresist development process.

81. The method of claim 76, wherein measuring the reflected light comprises measuring the intensity of the reflected light.

82. The method of claim 76, further comprising forming said at least one sub-nominal grating structure in said layer of photoresist such that said plurality of photoresist features have a critical dimension that is less than a critical dimension of additional photoresist features formed in said layer of photoresist, said additional photoresist features to be used as a mask in etching production features in an integrated circuit device.

83. The method of claim 76, wherein forming a process layer comprises forming a process layer comprised of at least one of a metal, polysilicon and an insulating material having a dielectric constant less than 5.0.

84. The method of claim 77, wherein forming a layer of photoresist above said process layer comprises forming a layer of positive or negative photoresist above said process layer.

* * * * *